US012429362B2

(12) United States Patent
Ziegler et al.

(10) Patent No.: US 12,429,362 B2
(45) Date of Patent: Sep. 30, 2025

(54) INDUCTIVE SENSOR ASSEMBLY FOR DETECTING A CHANGE IN POSITION OF AN ACTUATING ELEMENT

(71) Applicant: Huf Hülsbeck & Fürst GmbH & Co. KG, Velbert (DE)

(72) Inventors: Alexander Ziegler, Wülfrath (DE); Christian Chabrowski, Mülheim Nordrhein-Westfalen (DE)

(73) Assignee: Huf Hülsbeck & Fürst GmbH & Co. KG (DE)

( * ) Notice: Subject to any disclaimer, the term of this patent is extended or adjusted under 35 U.S.C. 154(b) by 163 days.

(21) Appl. No.: 17/784,494

(22) PCT Filed: Aug. 19, 2020

(86) PCT No.: PCT/EP2020/073230
§ 371 (c)(1),
(2) Date: Nov. 2, 2022

(87) PCT Pub. No.: WO2021/121682
PCT Pub. Date: Jun. 24, 2021

(65) Prior Publication Data
US 2023/0050930 A1    Feb. 16, 2023

(30) Foreign Application Priority Data
Dec. 18, 2019   (DE) ............... 10 2019 134 953.2

(51) Int. Cl.
*G01D 5/20* (2006.01)
*E05B 81/76* (2014.01)
(52) U.S. Cl.
CPC ........... *G01D 5/2006* (2013.01); *E05B 81/77* (2013.01)

(58) Field of Classification Search
CPC ....... G01D 5/2006; E05B 81/77; E05B 81/76; H03K 17/9547; H03K 17/954; H03K 17/97; H03K 2017/9706; H03K 2217/9651
See application file for complete search history.

(56) References Cited

U.S. PATENT DOCUMENTS 5,574,366 A * 11/1996 Joost .............. G01B 7/023
324/207.16
5,760,577 A * 6/1998 Shizuya ............. G01F 23/20
324/207.16
(Continued)

FOREIGN PATENT DOCUMENTS

GB      2494183 A      3/2013
KR      100212176 B1 *  8/1999
WO   WO 2019/122867 A1  6/2019

OTHER PUBLICATIONS

International Preliminary Report on Patentability of International Application No. PCT/EP2020/073230 dated Jun. 30, 2022 and English Translation (17 pages).
(Continued)

*Primary Examiner* — Lee E Rodak
*Assistant Examiner* — Demetrius R Pretlow
(74) *Attorney, Agent, or Firm* — Lippes Mathias LLP

(57) ABSTRACT

An inductive sensor assembly is used for detecting a change in position of an actuating element. The sensor assembly has: an LC resonant circuit having an inductive element (L) and a capacitive element (C); an excitation supply which is coupled to the LC resonant circuit in order to excite the LC resonant circuit with an excitation voltage (U); a decoupling element arranged between the excitation supply and the LC resonant circuit; and, an evaluation arrangement for evalu-
(Continued)

ating the signal decreasing across the resonant circuit. An actuating assembly is also provided.

3 Claims, 1 Drawing Sheet

(56) References Cited

U.S. PATENT DOCUMENTS

| | | | | |
|---|---|---|---|---|
| 5,818,129 | A * | 10/1998 | Fericean | H03K 17/9502 |
| | | | | 361/182 |
| 9,995,065 | B2 * | 6/2018 | Witte | E05B 85/16 |
| 10,428,562 | B2 | 10/2019 | Guibbert et al. | |
| 2014/0253107 | A1 * | 9/2014 | Roach | G01N 27/90 |
| | | | | 324/207.17 |
| 2018/0331684 | A1 * | 11/2018 | Koizumi | G01D 5/204 |
| 2019/0094404 | A1 | 3/2019 | Hasegawa et al. | |
| 2020/0386530 | A1 * | 12/2020 | Starkey | H03M 1/12 |

OTHER PUBLICATIONS

Office Action for European Application No. 20760439.8, dated Feb. 2, 2024, 6 pages.
International Search Report of International Application No. PCT/EP2020/073230 dated Nov. 5, 2020 and English Translation (4 pages).

* cited by examiner

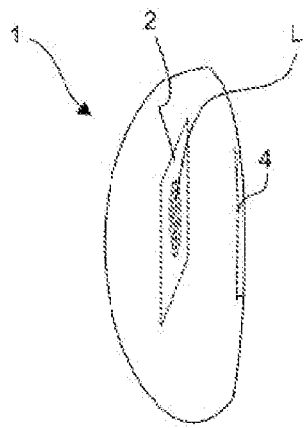
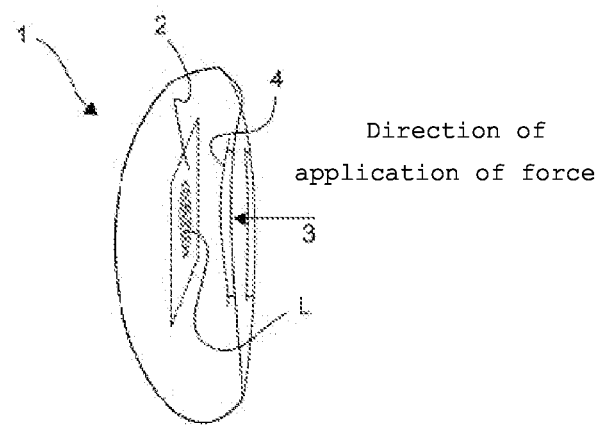
Fig. 1a
Fig. 1b
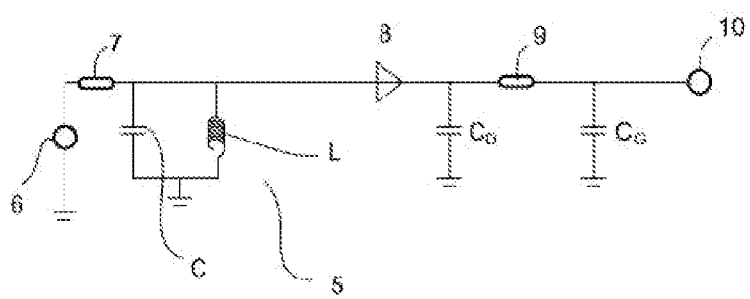
Fig. 2

INDUCTIVE SENSOR ASSEMBLY FOR DETECTING A CHANGE IN POSITION OF AN ACTUATING ELEMENT

BACKGROUND OF THE DISCLOSURE

The invention relates to an inductive sensor assembly. The invention also relates to an actuating assembly.

Inductive sensor assemblies are playing an increasing role in modern motor vehicles, for example for detecting an actuation of a so-called fixed door handle and triggering the door opening triggered thereby. The functional principle of inductive sensor assemblies is based on the detection of a change in an electromagnetic field when a metallic or ferromagnetic actuating element moves in the electromagnetic field. The underlying physical effect is the change in the inductance and/or the quality of the inductance as a result of a change in position of the conductive and/or ferromagnetic element relative to the component that generates the inductance. The conductive or ferromagnetic element can be, for example, an actuation region of a knob of a door handle or a part of an actuation region of the knob of the door handle. Due to the fact that inductive sensors can also be used to detect minor changes in position, for example in the micrometer range, the use of inductive sensors is particularly interesting for the so-called fixed door handles that are increasingly being used.

Reliable detection of a change in location of a metallic actuating element is important when providing actuating assemblies with inductive sensor assemblies. It is also desirable that the actuating assembly be economical to manufacture.

SUMMARY OF THE DISCLOSURE

The object of the invention is to provide an alternative to already existing actuating assemblies. The considerations to be found should result in the expectation of a sufficiently reliable detection of a change in location of an actuating element and allow an actuating assembly to be produced with reasonable economic efficiency.

The object is achieved with an inductive sensor assembly and an actuating assembly of the present disclosure.

An inductive sensor assembly is provided for detecting a change in position of an actuating element, in particular a metallic actuating element. The sensor assembly has at least the following components:
- an LC resonant circuit having an inductive element (L), preferably a coil or a combination of a plurality of coils, and having a capacitive element (C), for example a capacitor or a plurality of capacitors;
- an excitation supply which is coupled to the LC resonant circuit in order to excite the LC resonant circuit with an excitation voltage (U),
- a decoupling element arranged between the excitation supply and the LC resonant circuit,
- an evaluation assembly for evaluating the signal decreasing across the resonant circuit.

In particular, a high-impedance series resistor can be provided as a decoupling element, which resistor is connected between the excitation supply and the resonant circuit. The high-impedance series resistor can, for example, have a resistance value between 1 kOhm and 10 kOhm, preferably between 3 kOhm and 7 kOhm. Of course, the decoupling element can also have more than one component; the functionality of the high-impedance decoupling is substantial.

The excitation voltage is preferably output by the excitation supply as a sequence of voltage pulses, particularly preferably as a sequence of square-wave pulses. The voltage pulses can be output, for example, with an operating frequency between 1 MHz and 10 MHz, preferably 5 MHz to 10 MHz, particularly preferably 7 MHz to 9 MHz. Alternatively, however, other variants of the excitation voltages are also conceivable, for example excitation using an excitation signal that follows a sine curve, i.e. with an excitation voltage that is described as a sine function or sine oscillation as a function of time. In this case, the operating frequencies can likewise be between 1 MHz and 10 MHz, preferably 5 MHz to 10 MHz, particularly preferably 7 MHz to 9 MHz.

For example, a NOC, numerically controlled oscillator, often also referred to as a DCO, digitally controlled oscillator, can be used as the excitation supply, which results in the advantage that a timer required for the output of voltage pulses is already a component of the excitation supply. The excitation supply can also be referred to as the signal source; the term signal source is familiar in connection with the operation of a resonant circuit.

The LC resonant circuit is preferably a parallel resonant circuit, but in principle the sensor assembly can also be used with an LC resonant circuit designed as a series resonant circuit.

A structurally simple variant is preferred, in which precisely one coil forms the inductive element and precisely one capacitor forms the LC resonant circuit as the capacitive element. Alternatively, it can also be provided that several inductive components and/or several capacitive components are provided, in which case the capacitive element then represents the overall capacitive effect or the inductive element represents the overall inductive effect within the framework of an equivalent circuit diagram consideration.

In particular, it can be provided that at least the excitation supply, the resonant circuit, the line connection, and/or the decoupling element are contained in the same microcontroller, preferably also the evaluation assembly. The provision of all or many functionalities of the sensor assembly within a microcontroller means that the sensor assembly can be provided very cost-effectively by programming a microcontroller.

In one embodiment, the evaluation assembly has a rectifier circuit.

An inductive sensor assembly for detecting a change in position of an actuating element is therefore proposed. To determine the change in position of the actuating element, electromagnetic properties of the LC resonant circuit are measured, with the LC resonant circuit being detuned when the position of the LC resonant circuit changes:
- an LC resonant circuit having the inductive element (L) and the capacitive element (C).
- an excitation supply which is coupled to the LC resonant circuit in order to excite the LC resonant circuit with an excitation voltage (U). The excitation supply is preferably a pin controller, the output pin of which is coupled to the LC resonant circuit via a conductor, with a decoupling resistor with a high resistance value, for example between 1 kOhm and 10 kOhm, preferably between 4 kOhm and 6 kOhm, being arranged between the output pin and the LC resonant circuit.
- an evaluation assembly for evaluating the decreasing signal across the resonant circuit. The evaluation assembly is preferably a series circuit made up of a rectifier circuit and an ADC, with the rectifier circuit and ADC being particularly preferred for signal smoothing via a further capacitive element, optionally additionally via a high-impedance resistor.

The rectifier circuit causes a DC voltage signal to be present instead of a high-frequency AC voltage. In the preferred embodiment, in which the rectifier circuit consists of a diode and a capacitance arranged in parallel with the resonant circuit, the voltage occurring across the capacitance of the rectifier is a measure of the amplitude of the AC voltage. The prerequisite is, of course, that the capacitance is large enough, which is the responsibility of a person skilled in the art in the design. The voltage across the capacitance is determined at the ADC and, for example, compared with a desired value and/or checked for undershooting a lower threshold value and/or checked for exceeding the upper threshold value. This is the evaluation carried out in the present application of the signal decreasing across the resonant circuit, indirectly via the rectified voltage value. In the event that one or more of the conditions is or are fulfilled in a manner that is predetermined and dependent on the specific design of the sensor assembly, the actuating element is detected as deviating from the non-actuated position and actuation is thereby ascertained. This can cause a triggering circuit coupled to the evaluation assembly to output an actuation signal.

A major advantage of the procedure described is that a complex and error-prone time-resolved measurement of a high-frequency, time-dependent voltage is traced back to the measurement of a rectified—and therefore significantly less time-dependent—signal. The implementation of this measurement thus results in a robust detection of a change in position that is less dependent on deviations in the time recording or the accuracy of a timer.

In a preferred embodiment, the excitation supply is set up to output the excitation voltage at an operating frequency that corresponds to the natural frequency of the resonant circuit or is tuned to it. Being tuned to the natural frequency preferably means that an excitation voltage is found empirically, which already causes clear effects with the smallest possible changes in position. In concrete terms, this means that, for example, an operating point of the excitation voltage is found which has the greatest possible slope in the signal-frequency curve (with the signal on the y-axis). Typically, this is a frequency that is close to the natural frequency. For example, it can be provided that the excitation voltage deviates from the natural frequency of the resonant circuit by less than 5 percent. An operating frequency close to the natural frequency of the resonant circuit means that even a small change in the inductance of the inductive element and/or the quality of the inductance of the inductive element results in a strong change in the signal decreasing across the resonant circuit, which consequently results in a high measuring sensitivity of the inductive sensor assembly. In a development in particular, which has a rectifier circuit as component of the evaluation assembly, it is possible to evaluate a parameter that is dependent on the rectified signal. It is preferred that a rectified voltage is measured. It is advisable to carry out such an evaluation only at a point in time when the rectified signal has been saturated, for example after at least five, preferably at least ten, excitation periods have elapsed.

The rectifier circuit preferably has a diode and a capacitance ($C\_D$) that is preferably connected in parallel with the resonant circuit. This design has the advantage of being particularly simple and therefore cost effective.

The rectifier circuit is preferably arranged between the LC resonant circuit and an ADC of the evaluation assembly, wherein the evaluation assembly is set up to detect a voltage value rectified at the rectifier with the ADC and to detect a change in position as present depending on the detected voltage value.

Provision is preferably made for the evaluation assembly to be an ADC present in the microcontroller, alternatively having an ADC as a component.

The evaluation assembly is particularly preferably set up to detect a change in position as present if an upper threshold voltage value is exceeded or if a lower threshold voltage value is undershot.

According to one embodiment of the sensor assembly, the evaluation assembly is set up to detect a change in position as present precisely if an upper threshold voltage value is exceeded or if a lower threshold voltage value is undershot. In particular, it can be provided that the change in position is detected as present precisely if an upper threshold voltage value is exceeded or if a lower threshold voltage value is undershot.

In an alternative embodiment of the invention, the evaluation assembly does not have a rectifier circuit, and an ADC of the evaluation assembly detects a voltage decreasing across the resonant circuit. In this embodiment, it is substantial that an inertia of the ADC is adapted to an operating frequency of the excitation supply in such a way that a minimum measurement duration of the ADC lasts at least one period of the resonant circuit excitation, preferably between 5 and 1000 periods of the resonant circuit excitation, particularly preferably between 5 and 100 periods of the resonant circuit excitation, more preferably between 5 and 20 periods of the resonant circuit excitation. In simulations, 10 periods of the resonant circuit excitation and neighboring values have proven to be particularly suitable. The effect of this is that the ADC cannot follow the time-dependent voltage change, but instead the time-dependent voltage results in a substantially time-independent measured value of the voltage for the ADC. This embodiment therefore makes use of a disadvantage of comparatively cost-effective ADCs, namely a poor time resolution.

One idea of the invention relates to an actuating assembly, in particular on a motor vehicle, comprising a sensor assembly according to one of the preceding claims and a metallic actuating element, wherein the metallic actuating element carries out a change in position relative to the inductive element when actuated.

The metallic actuating element is movable or deformable relative to the electromagnetic field of the inductive element, both of which are encompassed by the preamble of the change in position. The change in position results in the change in inductance and/or equivalent inductance and/or quality of the inductance of the inductive element, which was already explained at the outset, whereby the LC resonant circuit is in turn detuned and thus the value of the rectified voltage amplitude is changed compared to the voltage amplitude present in the state of equilibrium. The change in the voltage amplitude can then be used to directly infer the change in position of the metallic actuating element. A change in position can be interpreted as present by the evaluation assembly, for example, if an upper threshold voltage determined by a person skilled in the art depending on the required accuracy and/or the tolerated false-positive measurements is exceeded and/or a lower threshold voltage is undershot.

The term metallic actuating element describes the property of influencing the electromagnetic field generated by the inductive element and thus, for example, the quality of the inductance of the inductive element. For this purpose, the metallic actuating element can consist, for example, of a metal or have a metal, but the actuating element can also be qualified as a metallic actuating element by materials other than metals, for example by a material that has metallic conduction properties sufficient to influence the electromagnetic field, such as this is the case, for example, with some transition metal nitrides such as titanium nitride.

It goes without saying that it is up to a person skilled in the art commissioned with the implementation of the invention to adapt and tune the dimensioning of the resonant circuit and the excitation voltage on the one hand, and the shape and positioning of the actuating element on the other hand, with a minimal change in the voltage curve at the output of the rectifier circuit from which point onwards a change in position of the actuating element can or should be assumed. However, this is not substantial for the basic functioning of the present invention, as long as the actuating element influences the electromagnetic field of the actuating element in the case of a change in location within predetermined parameters and this influence results in a reliably detectable phase shift in a reproducible manner, which is considered above a value specified by a person skilled in the art as detection of the actuation of the change in position. Such a design in itself does not pose any fundamental challenges for a person skilled in the art, but customary considerations must be made, for example between the required sensitivity of a detection of the change in position on the one hand and the tolerated extent of false-positive detections.

The actuating assembly is preferably a door handle of a vehicle door or a vehicle flap, with the inductive sensor assembly being arranged inside the door handle. The actuating element is particularly preferably arranged on the door handle or is a component part of the door handle, preferably a component part of a casing portion of the door handle.

BRIEF DESCRIPTION OF THE DRAWINGS

FIG. 1a is a schematic sketch of an actuating assembly according to an embodiment of the disclosure;

FIG. 1b is another schematic sketch of an actuating assembly according to an embodiment of the disclosure;

FIG. 2 is a schematic circuit diagram of an inductive sensor assembly according to an embodiment of the disclosure.

DETAILED DESCRIPTION OF THE DISCLOSURE

FIG. 1a is a schematic cross-sectional view of an actuating assembly 1 of a motor vehicle. In the embodiment shown by way of example, the actuating assembly 1 is a knob of a door handle, which knob is shown in cross section. Inside the knob 1, an inductive sensor assembly 2 is shown, which sensor assembly is arranged in its entirety on a circuit board in the embodiment shown. The inductive sensor assembly has a resonant circuit having a coil L. A metallic actuating element 4 designed as a metal foil is arranged on the casing portion of the door handle and on the inside of the door handle. The metallic actuating element 4 is arranged opposite the coil L of the inductive sensor assembly 2. Due to the resilient behavior of the casing portion of the door handle, the metallic actuating element 4 can be moved relative to the sensor assembly 2.

FIG. 1b shows how an effect on the casing portion is brought about as a result of the exertion of force (symbolized by the arrow 3 shown). As a result of the application of force, the metallic actuating element 4, which is designed as a metal foil, has carried out a change in position. The change in position is a consequence of a sectional change in location of the actuating element 4 in relation to the sensor assembly 2 as a result of the deformation of the actuating element 4. The change in location of the actuating element also occurred in particular relative to the coil L of the sensor assembly 2. The sensor assembly 2 serves the purpose of detecting the actuation that manifests itself in the deformation of the actuating element 4.

FIG. 2 shows an embodiment of an inductive sensor assembly according to the invention. The sensor assembly has an LC resonant circuit 5 which has the inductive element L and the capacitive element C. The inductive element represents the component of the sensor assembly which provides the functionality for detecting the change in position of a metallic and/or ferromagnetic actuating element. In the embodiment shown, the resonant circuit 5 is a parallel resonant circuit which is coupled to the excitation supply 6 via the decoupling resistor 7. The excitation supply 6 is a pin controller, the output pin of which provides the excitation signal for the resonant circuit 5. In the representation shown, the decoupling resistor has a resistance value of 5 kOhm. The evaluation assembly for evaluating the signal decreasing across the resonant circuit is made up of the rectifier 8, the capacitance $C_D$ (also referred to as C_D), which together form the rectifier circuit; together with the ADC 10 and resistor 9 and capacitance $C_G$, which are used for signal smoothing but are not absolutely necessary for the actual functionality.

The invention claimed is:

1. An actuating assembly on a motor vehicle, comprising a metallic actuating element, and an inductive sensor assembly for detecting a change in position due to a deformation of the metallic actuating element as a result of an application of force, wherein the metallic actuating element carries out a change in position relative to an inductive element of the inductive sensor assembly when actuated,
    wherein the inductive sensor assembly comprises:
    an LC resonant circuit having the inductive element and a capacitive element, the LC resonant circuit being a parallel resonant circuit,
    an excitation supply which is coupled to the LC resonant circuit in order to excite the LC resonant circuit with an excitation voltage,
    a decoupling element arranged between the excitation supply and the LC resonant circuit, wherein the decoupling element is an ohmic resistor and,
    an evaluation assembly for evaluating the signal decreasing across the resonant circuit, wherein the evaluation assembly has a rectifier circuit, wherein the rectifier circuit is arranged between the LC resonant circuit and an ADC of the evaluation assembly, wherein the evaluation assembly is set up to detect a voltage value rectified at the rectifier with the ADC and to detect a change in position as present depending on the detected voltage value; and,
    wherein the rectifier circuit has a diode and a capacitance, the capacitance being connected in parallel with the LC resonant circuit, and wherein the diode is between the LC resonant circuit and the capacitance.

2. An actuating assembly according to claim 1, wherein the excitation supply is set up to output the excitation voltage at an operating frequency that corresponds to the natural frequency of the resonant circuit or is tuned to it.

3. An actuating assembly according to claim 1, wherein the evaluation assembly is set up to detect a change in position as present if an upper threshold voltage value is exceeded or if a lower threshold voltage value is undershot.

* * * * *